(12) United States Patent
Benoit et al.

(10) Patent No.: US 10,955,457 B2
(45) Date of Patent: Mar. 23, 2021

(54) METHOD AND DEVICE FOR DEDUCING PRESENCE OF FAULTS IN A TRANSMISSION LINE NETWORK

(71) Applicant: COMMISSARIAT A L'ENERGIE ATOMIQUE ET AUX ENERGIES ALTERNATIVES, Paris (FR)

(72) Inventors: Jaume Benoit, Palaiseau (FR); Antoine Dupret, Orsay (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 99 days.

(21) Appl. No.: 16/463,833

(22) PCT Filed: Nov. 22, 2017

(86) PCT No.: PCT/EP2017/080101
§ 371 (c)(1),
(2) Date: May 23, 2019

(87) PCT Pub. No.: WO2018/095985
PCT Pub. Date: May 31, 2018

(65) Prior Publication Data
US 2019/0331727 A1    Oct. 31, 2019

(30) Foreign Application Priority Data
Nov. 25, 2016 (FR) ........................ 1661491

(51) Int. Cl.
*G01R 31/08* (2020.01)

(52) U.S. Cl.
CPC .................... *G01R 31/086* (2013.01)

(58) Field of Classification Search
CPC ...... G01R 31/086; G01R 31/085; Y04S 10/52
See application file for complete search history.

(56) References Cited

U.S. PATENT DOCUMENTS 10,120,012 B2* 11/2018 Burek ................. G01R 31/085
2014/0300370 A1 10/2014 Paolone et al.

OTHER PUBLICATIONS

Razzaghi, et al., "On the use of electromagnetic time reversal to locate faults in series-compensated transmission lines", 2013 IEEE Grenoble Conference, pp. 1-5, Jun. 16, 2013.
(Continued)

*Primary Examiner* — Jay Patidar
(74) *Attorney, Agent, or Firm* — BakerHostetler

(57) ABSTRACT

A method for analyzing faults affecting a transmission line network includes at least one line segment having a plurality of ends, the method comprising the steps of: acquiring, at at least two ends of the line network, a measurement of a signal being propagated in the network, applying a time reversal to each signal measurement, for each segment of the line network, constructing a cost function dependent on the time and the distance from a point of the segment to an end of the network, searching for at least one extremum of the cost function over all of the segments of the line network and retaining the coordinates of the extremum, deducing therefrom the presence of a fault at a position and an instant of occurrence that are given by the coordinates of the extremum.

10 Claims, 5 Drawing Sheets

(56) References Cited

OTHER PUBLICATIONS

Manesh, et al., "A new method to locate faults in power networks based on Electromagnetic Time Reversal", Signal Processing Advances in Wireless Communications (SPAWC), pp. 469-474, Jun. 17, 2012.
Gaugaz, et al., "Implementation guidelines for a real-time fault location system in electrical power networks", 2016 15th Biennial Baltic Electronics Conference (BEC), pp. 47-50, Oct. 3, 2016.
Razzaghi, et al., "An Efficient Method Based on the Electromagnetic Time Reversal to Locate Faults in Power Networks", vol. 28, No. 3, pp. 1663-1673, Jul. 1, 2013.
Sahmarany, "Méthodes d'amélioration pour le diagnostic de câble par réflectométrie", pp. 1-196, Dec. 17, 2013.
Fink, "Time reversal of ultrasonic fields—Part I: Basic principles", IEEE Transactions on Ultrasonics Ferroelectrics and Frequency Control, vol. 39, No. 5, pp. 555-566, Sep. 5, 1992.
Nocedal, et al., "Numerical Optimization", Springer-Verlag New York, 2006.

* cited by examiner

METHOD AND DEVICE FOR DEDUCING PRESENCE OF FAULTS IN A TRANSMISSION LINE NETWORK

CROSS-REFERENCE TO RELATED APPLICATIONS

This application is a National Stage of International patent application PCT/EP2017/080101, filed on Nov. 22, 2017, which claims priority to foreign French patent application No. FR 1661491, filed on Nov. 22, 2016, the disclosures of which are incorporated by reference in their entirety.

FIELD OF THE INVENTION

The invention relates to the field of wire diagnostic systems and more specifically those which aim to locate intermittent faults (for example short-circuits) in a transmission line network.

The invention applies to any type of electrical cable, in particular power transmission cables, in fixed or mobile installations. The cables concerned can be coaxial, two-wire, in parallel lines, in twisted pairs or other.

BACKGROUND

Cables, or more generally transmission lines, are omnipresent in all electrical systems, for power supply or information transmission. These cables are subjected to the same constraints as the systems that they link and can be subject to failures. In particular, intermittent faults can occur and it is important to be able to detect and locate such faults in order to improve the maintenance of the cables.

This problem is all the more difficult to resolve when it involves a transmission line network composed of numerous line segments interconnected with each other by junctions.

One known solution for spatially and temporarily locating an intermittent fault in a cable network is based on the principle of time reversal introduced by Mathias Fink in the reference "M. Fink, *Time Reversal of ultrasonic fields-Basic principles*", IEEE Trans. Ultrason., Ferroelec., Freq. Contr. vol. 39, no. 5, pp. 555-566, 1992."

This principle was established first in the field of acoustics but was found to be also applicable in the field of electromagnetism and then generally in all fields governed by wave propagation laws.

The equations for propagation of a wave in a transmission line are expressed as follows:

$$\frac{\partial^2 V}{\partial z^2} = LC\frac{\partial^2 V}{\partial t^2} + (RC+LG)\frac{\partial V}{\partial t} + RGV$$

$$\frac{\partial^2 I}{\partial z^2} = LC\frac{\partial^2 I}{\partial t^2} + (RC+LG)\frac{\partial I}{\partial t} + RGI$$

I and V respectively represent the current and the voltage in the transmission line.

R, L, C and G respectively represent the resistance, the inductance, the capacitance and the conductance of the transmission line.

When the losses in the transmission line are disregarded, the resistance and the conductance can be considered as being zero and the above equations then take the following form:

$$\frac{\partial^2 \varphi}{\partial z^2} = LC\frac{\partial^2 \varphi}{\partial t^2}$$

$\varphi=\varphi(z,t)$ represents the current or the voltage. The absence of first-order derivative in the above equation leads to the existence of a second solution $\varphi=\varphi(z,t)$ which corresponds to the first solution $\varphi=\varphi(z,t)$ time-reversed.

This principle can be used in particular to locate a fault at a point of a cable network which can be seen as a secondary emitting source. In effect, an intermittent fault of short-circuit type can generate a shock wave whose source is at the point of the fault and which is propagated to the ends of the cables which make up the network.

This principle is represented schematically in FIG. 1 for a simple transmission line with two ends A and B and a fault occurring at an instant $t_0$ and at the point d. The fault behaves as a source positioned at the point d and which, at an instant $t_0$, generates a shock wave which takes the form of a pulse. This shock wave generates signals which are propagated from the location d of the fault. These signals can be recorded by measurement units (for example oscilloscopes) at the ends A and B of the line and denoted S(A,t) and S(B,t).

In a second phase, the recorded signals are time-reversed S(A,-t), S(B,-t). Next, by re-injecting the time-reversed signals at the same points (A, respectively B) where they were measured and synchronously, it is possible to make the same shock wave generated initially by the fault reappear at the point where the fault occurred.

To be able to locate the fault, it would be necessary to be able to simultaneously record, at all points of the transmission line, the current and voltage in order to detect the instant and the location of the re-focusing of the shock wave.

In practice, such processing is not possible and it is replaced by a digital method which consists in solving the equations with the partial derivatives introduced previously to calculate the current and the voltage at any point of the transmission line network and at each instant in order to determine the position and the instant of occurrence of the fault by searching for the maximum energy.

This digital solving phase can prove extremely costly in computation time and memory occupancy, all the more so when the cable network is large and/or the location is finely resolved.

In order to reduce the complexity of execution of the digital solving phase of a conventional method based on time-reversal, the invention proposes a method which consists in expressing, in a simplified manner, the voltage (or the current) at any point of a cable network and at any instant and in searching for the extrema of this function by using a constrained optimization algorithm.

SUMMARY OF THE INVENTION

One subject of the invention is a method for analyzing faults affecting a transmission line network comprising at least one line segment and having a plurality of ends, said method comprising the steps of:
- acquiring, at at least two ends of the line network, a measurement of a signal being propagated in the line network,
- applying a time-reversal to each signal measurement,
- for each segment of the line network, constructing a cost function dependent on the time and on the distance from a point of the segment to an end of the line network, by adding together the measurements of signals time-reversed and delayed by the propagation time of the signal between a point of the segment and the end of the line network associated with the measurement, searching for at least one extremum of the cost function over all of the segments of the line network and retaining the coordinates of the extremum, deducing therefrom the presence of a fault at a position and an instant of occurrence that are given by the coordinates of the extremum.

According to a particular variant of the invention, to construct the cost function, the measurements of time-reversed and delayed signals are weighted by an estimate of the inverse of the aggregated transmission coefficient between the end associated with the measurement and the segment of the line network.

According to a particular variant of the invention, to construct the cost function, the measurements of time-reversed and delayed signals are weighted by an estimate of an attenuation coefficient dependent on the distance between a point of the segment and the end of the line network associated with the measurement.

According to a particular variant of the invention, the estimate of an attenuation coefficient depends on the line network segment.

According to a particular variant, the method according to the invention further comprises the construction of a piecewise cost function defined over a plurality of intervals by the cost function corresponding to each segment of the line network.

According to a particular variant of the invention, the search for at least one extremum of the cost function is performed by means of an optimization algorithm of the gradient descent algorithm type.

According to a particular variant, the method according to the invention comprises a preliminary detection of a pulse characteristic of the presence of a fault in at least one of the measurements.

Another subject of the invention is a device for analyzing faults affecting a transmission line network comprising at least one line segment and having a plurality of ends, the device comprising:
 at least one measurement unit for acquiring, at at least two ends of the line network, a measurement of a signal being propagated in the line network,
 a component configured to:
  apply a time reversal to each signal measurement, for each segment of the line network, construct a cost function dependent on the time and on the distance from a point of the segment to an end of the line network, by adding together the measurements of signals time-reversed and delayed by the propagation time of the signal between a point of the segment and the end of the line network associated with the measurement,
  search for at least one extremum of the cost function over all of the segments of the line network and retain the coordinates of the extremum,
  deduce therefrom the presence of a fault at a position and an instant of occurrence that are given by the coordinates of the extremum.

The device for analyzing faults according to the invention can further comprise a means for displaying the position and the instant of occurrence of a fault.

Another subject of the invention is a computer program comprising instructions for executing the method for analyzing faults according to the invention, when the program is run by a processor, as well as a processor-readable storage medium on which is stored a program comprising instructions for executing the method for analyzing faults according to the invention, when the program is run by a processor.

BRIEF DESCRIPTION OF THE DRAWINGS

Other features and advantages of the present invention will become more apparent on reading the following description in relation to the attached drawings, which represent.

DETAILED DESCRIPTION

Figure 1:
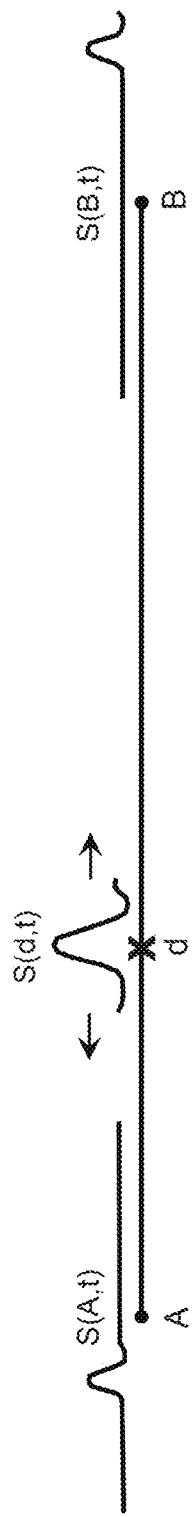
FIG. 1, a diagram of a transmission line exhibiting a fault that is the source of generation of a signal,
 FIG. 2, a diagram of a transmission line network comprising three line segments and an intermittent fault,
 FIGS. 3a, 3b, 3c, three examples of measurements of the signal generated by the fault and propagated back to the three ends of the network,
 FIG. 4, a diagram of a different representation of the network of FIG. 2,
 FIG. 5, a flow diagram detailing the steps of implementation of the method according to the invention,
 FIG. 6, a diagram of an exemplary embodiment of a detection device according to the invention.
Figure 2:
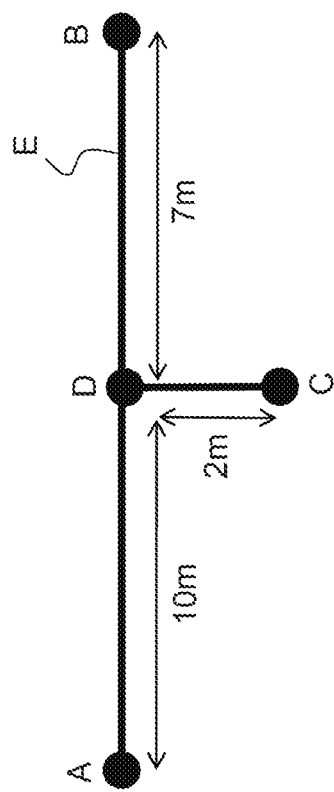

The invention applies to any transmission line or, more generally, any transmission line network formed by line segments interconnected by junctions. An example of a line network is represented in FIG. 2. This example illustrates a network composed of three line segments [AD], [DB] and [DC] of different sizes, the segments being connected by the junction D.

An intermittent fault occurs at an instant to at the point E of the segment [DB]. The fault acts as a source which generates a shock wave which takes the form of a pulse which is propagated toward the ends A, B and C of the network.

Figure 3A:
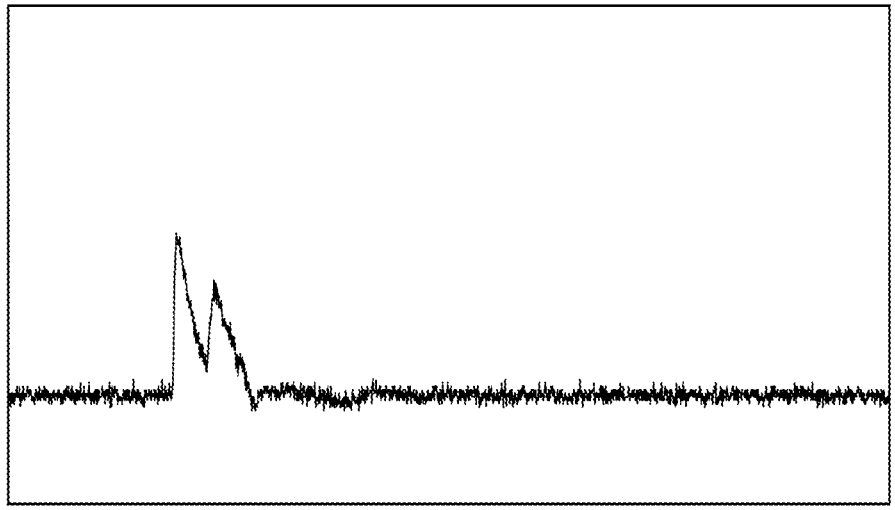
Figure 3B:
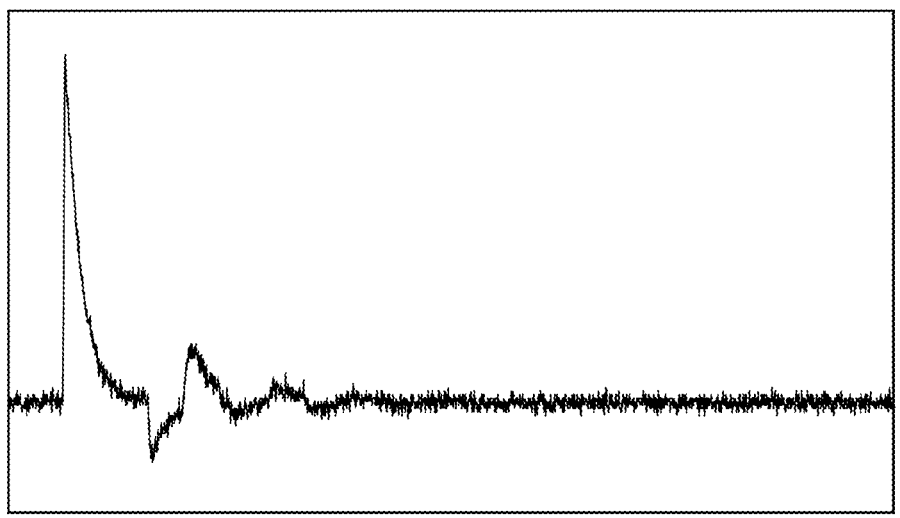
Figure 3C:
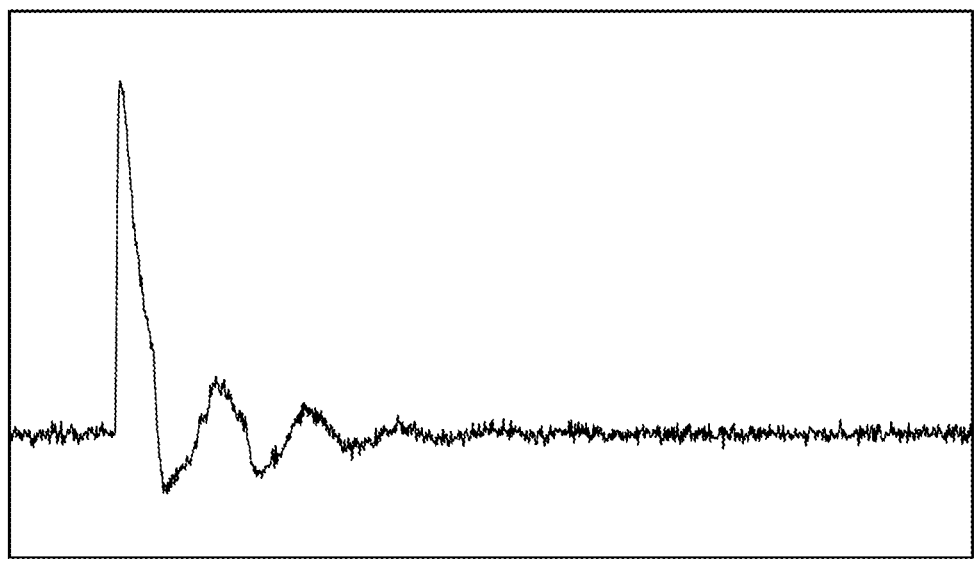

FIGS. 3a, 3b and 3c show examples of signals measured respectively at the ends A, B and C when an intermittent fault occurs at the point E. From the three measurements, the signature of the fault which has generated the shock wave can be identified.

These three measurements (or more generally N measurements in the case of a network with N ends) are exploited by the invention to determine the instant of occurrence and the position E of the fault.

An end of a wire network corresponds to an end of a cable included in this network and which is not linked to other cables of the network.

Figure 5:
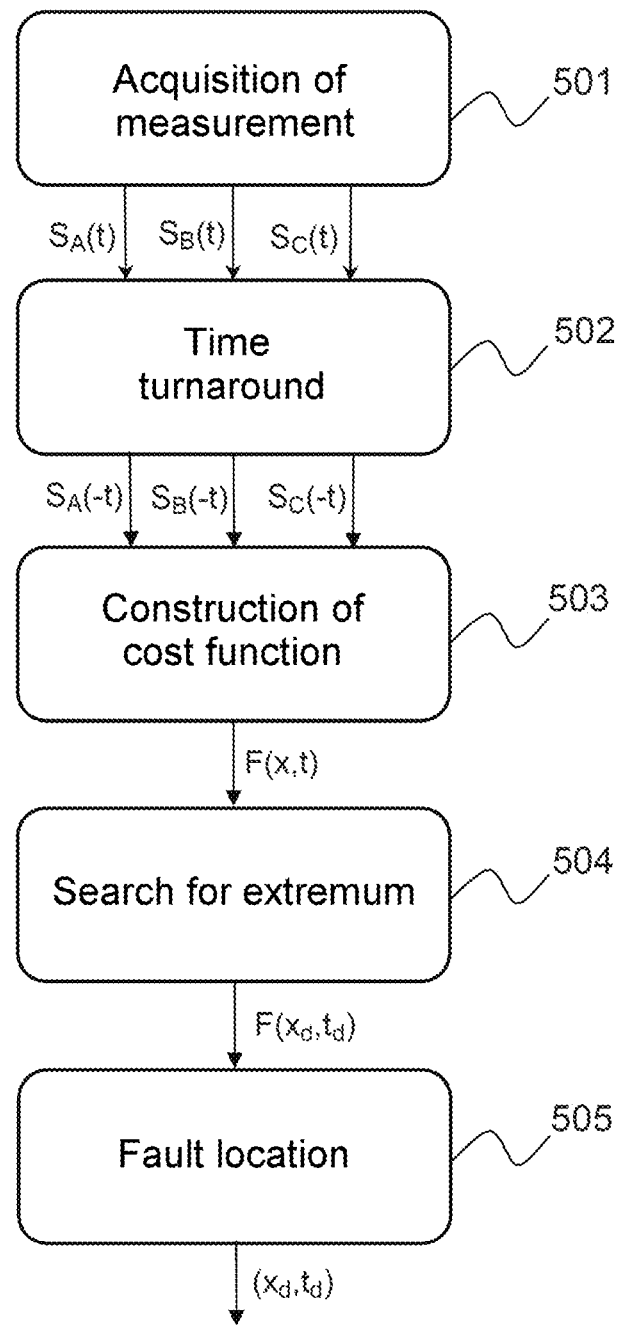

The steps of the method according to the invention are illustrated in the flow diagram of FIG. 5.

In a first step 501, the signal received at each end of the wire network in which it is desired to detect and locate a fault is measured. The measurements can be done by means of measurement units capable of recording a signal that is propagated in a transmission line. The measurement units can make the recordings directly at the ends of the lines of the network but can also make the recordings at other points of the network, for example points close to the ends. A measurement unit can be, for example, a digital oscilloscope with memory.

Advantageously, the signal received at each end of the network is measured. However, in a secondary embodiment of the invention, it is possible to perform measurements only at some of the ends of the network. In other words, the invention can be implemented from at least two measurements performed at two ends. One advantage in using a number of measurements equal to the number of ends of the network is that that guarantees a total elimination of the fault location ambiguities. In the case where the number of measurements is smaller than the number of ends of the network, location ambiguities can remain, depending on the topology of the network, but the invention makes it possible nevertheless to provide information on the potential positions of the fault or faults.

The recorded measurements are of the type of those described in FIGS. 3a, 3b, 3c. They each consist in a recording of the signal received at a point of the network over a predetermined time period.

The method according to the invention can be activated when the signature of a fault is identified from at least one measurement or can be executed permanently by performing successive recordings. One benefit in executing the invention permanently is to be able to detect intermittent faults, that is to say faults which generate a shockwave in the network during a short time interval.

The invention can also be applied to the detection of permanent faults and can be coupled to a method called reflectometry, which consists in first injecting a test signal into the network then in measuring the reflections of this test signal on a possible fault.

In a second step 502, the recorded measurements are time-reversed, that is to say that an operation consisting in temporally reversing the order of the samples is applied to each measurement.

In a third step 503, a cost function $F(x,t)$ is constructed that is dependent on the time t and on the position x of a point in the network, from the time-reversed measurements.

The position x of a point is evaluated by the distance from the point to each end of the network $d(x,x_e)$.

The cost function $F(x,t)$ represents an estimate of the signal, measured at each instant t and at each position x of the line network, resulting from the injection, at each end of the network, of the signal time-reversed in the step 502. In other words, the cost function $F(x,t)$ aims to estimate the signal corresponding to the superimposition of the different signals time-reversed and injected at each end of the network. When applied to the example of FIG. 3, the step 503 of the method aims to estimate the signal measured at each instant and at any point of the network, following the injection at the points A, B and C of the measurements $S(A,-t)$, $S(B,-t)$, $S(C,-t)$ performed in the step 501 then time-reserved in the step 502.

Figure 4:
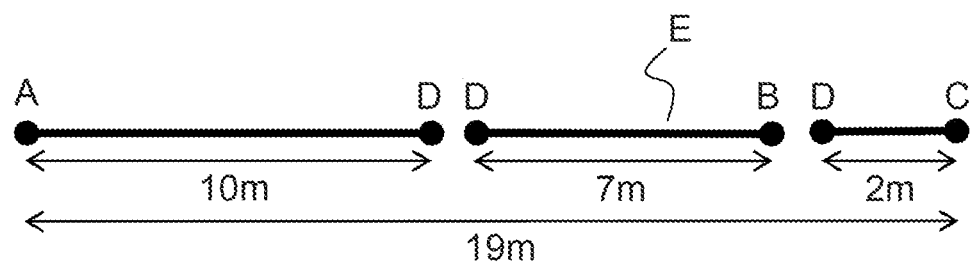

The cost function $F(x,t)$ is calculated independently for each segment of the line network which can be represented by the succession of the different segments of which it is composed. For example, the network of FIG. 2 can be represented in the form indicated in FIG. 4 by the succession of the three segments [AD], [DB] and [DC], the fault having occurred at the point E belonging to the segment [DB]. The order and the arrangement of the segments is unimportant.

For each segment, the cost function $F(x,t)$ is calculated by adding together the different measurements of signals time-reversed and delayed by the propagation time of a wave between the measurement point (which is also the simulated point of injection of the time-reversed signal) and a point of the network of coordinate x.

Thus, the cost function $F(x,t)$ can be represented by the following formula:

$$\forall (x, t) \in \omega_b \times [0, T_{rec} + T_{max}], F(x, t) = \sum_{e=1}^{NbE} \left[ SR_e\left(t - \frac{d(x, x_e)}{v}\right) \right] \quad (1)$$

$\omega_b$ is the set of the points of the branch b of the network, $T_{rec}$ and $T_{max}$ are, respectively, the total time of recording of the signals and the time taken by a signal to travel the maximum distance present in the network, NbE is the number of recordings at different points of the network performed in the step 501. This number is at least equal to two and at most equal to the number of ends of the network, $SR_e(t)$ is the measurement of the signal performed at the point e and time-reversed, $d(x,x_e)$ is the distance between any point of the network, of coordinate x, and an end of the network, of coordinate $x_e$, v represents the velocity of propagation of the signals in the network and therefore $d(x,x_e)/v$ represents the time taken for the signal to travel the distance $d(x,x_e)$.

According to a first variant embodiment, the cost function $F(x,t)$ can be modified to take account of the attenuation of the waves in their propagation in each segment of the network. The relationship (1) then becomes:

$$F(x, t) = \sum_{e=1}^{NbE} \left[ SR_e\left(t - \frac{d(x, x_e)}{v}\right) \right] \times e^{\alpha_b d(x, x_e)}$$

$a_b$ is a total attenuation coefficient of the signal throughout the travel of the signal between the points of respective coordinates $x_e$ and x.

According to a second variant embodiment, the cost function $F(x,t)$ can also be modified to take account of the energy losses of the signal in its passage through a junction between two segments. In effect, returning to the example of FIG. 2, when the signal generated at the point E toward the point A arrives at the junction D, only a portion of its energy is transmitted toward the point A. To take account of this phenomenon, the relationship (1) can be modified as follows:

$$F(x, t) = \sum_{e=1}^{NbE} \left[ SR_e\left(t - \frac{d(x, x_e)}{v}\right) \times \frac{1}{C_e^b} \right]$$

$C_e^b$ is the aggregated transmission coefficient between the end e and the branch b. In the case where more than one junction is crossed by the signal, the coefficient $C_e^b$ is obtained by multiplying the transmission coefficients associated with each junction crossed.

By taking into account both the attenuations and the coefficients of transmission, the following relationship is obtained:

$$F(x, t) = \sum_{e=1}^{NbE} \left[ SR_e\left(t - \frac{d(x, x_e)}{v}\right) \times \frac{1}{C_e^b} \times e^{\alpha_b d(x, x_e)} \right]$$

In a step 504, there is then a search for at least one extremum of the function $F(x,t)$ whose coordinates indicate the location and the occurrence of a fault.

Any digital solving method making it possible to search for one or more extrema of a function with two variables can be envisaged to perform the step 504.

For example, a gradient descent algorithm as described in the document "J. Nocedal, S. Wright, "Numerical Optimization", Springer-Verlag New York, 2006, ISBN 978-0-387-30303-1" can be envisaged. The extremum sought can be a maximum or a minimum depending on the algorithm used.

The search for extrema can be done in two stages. In a first stage, an extremum of the function calculated for each segment is sought. In a second stage, an extremum is sought over the extrema identified for each segment.

However, the search for extrema can also be done directly by constructing a single piecewise function over several intervals each corresponding to a segment.

The step 504 can target the search for a single extremum when the aim of the method is to locate a single fault, but it can also target the search for a plurality of extrema corresponding to a plurality of distinct faults. For this second case, the extrema search algorithm must be coupled to a detection threshold that makes it possible to discriminate the extrema corresponding to events associated with faults from the extrema corresponding to noise-related artefacts.

In a last step 505, the coordinates $(x_d, t_d)$ of the extremum or of the extrema are retained to locate one or more faults in the network. The coordinate $x_d$ makes it possible to locate the fault relative to the ends of the network or, more generally, to the measurement points of the step 501. The coordinate $t_d$ makes it possible to identify the instant of occurrence of the fault in a time reference frame synchronized with the instants at which the measurements are performed in the step 501.

The method according to the invention offers the particular advantage of being inexpensive and therefore of being able to be implemented in an embedded device. Thus, the invention makes it possible to perform a real-time analysis of the state of health of a wire network and in particular to detect the occurrence of intermittent faults which can be the precursors of more significant degradations in a cable.

Figure 6:
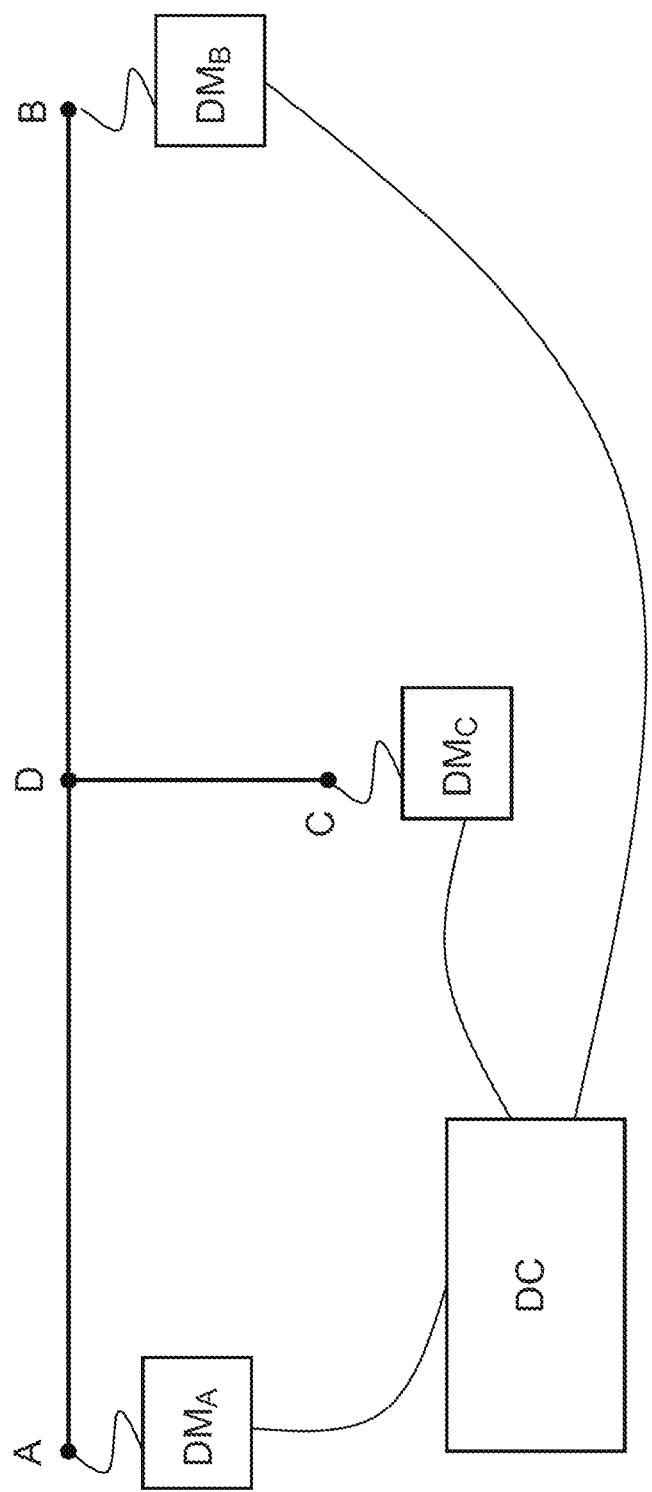

FIG. 6 schematically represents an analysis device capable of implementing the invention.

Such a device comprises at least one measurement unit $DM_A$, $DM_B$, $DM_C$, for acquiring a measurement of a signal being propagated in the wire network to the measurement points A, B and C. Such a measurement unit can be, for example, an oscilloscope or any other equivalent device. The device according to the invention can comprise a single measurement unit capable of performing measurements at different points A, B, C of the network or, on the other hand, a plurality of measurement units dedicated to a measurement at a single point.

The device according to the invention also comprises an electronic component DC of integrated circuit type, such as a programmable logic circuit, for example of FPGA type or a microcontroller, for example a digital signal processor, which receives the measurements and which is configured to execute the method according to the invention in order to detect and locate one or more faults.

Furthermore, a processing unit of computer, personal digital assistant, or other equivalent electronic or computer device type can be used to drive the device according to the invention and display the results of the calculations performed by the component DC on a human-machine interface, in particular the information on detection and location of faults on the cable.

The method according to the invention can be implemented on the component DC from hardware and/or software elements.

The method according to the invention can be implemented directly by an embedded processor or in a specific device. The processor can be a generic processor, a specific processor, an application-specific integrated circuit (known also by the acronym ASIC) or a field-programmable gate array (also known by the acronym FPGA). The device according to the invention can use one or more dedicated electronic circuits or a general-purpose circuit. The technique of the invention can be performed on a reprogrammable computation machine (a processor or a microcontroller for example) running a program comprising a sequence of instructions, or on a dedicated computation machine (for example a set of logic gates such as an FPGA or an ASIC, or any other hardware module).

The method according to the invention can also be implemented exclusively as a computer program, the method then being applied to previously recorded signal measurements. In such a case, the invention can be implemented as a computer program comprising instructions for its execution. The computer program can be stored on a processor-readable storage medium.

The reference to a computer program which, when run, performs any one of the functions described previously, is not limited to an application program running on a single host computer. On the contrary, the terms computer program and software are used here in a general sense to refer to any type of computer code (for example, application software, firmware, microcode, or any other form of computer instruction) which can be used to program one or more processors to implement aspects of the techniques described here. The computing means or resources can in particular be distributed ("Cloud computing"), possibly according to peer-to-peer technologies. The software code can be executed on any appropriate processor (for example, a microprocessor) or processor core or a set of processors, whether provided in a single computation device or distributed between a plurality of computation devices (for example as possibly accessible in the environment of the device). The executable code of each program allowing the programmable device to implement the processes according to the invention can be stored, for example, in the hard disk or in read-only memory. Generally, the program or programs will be able to be loaded into one or more storage means of the device before being executed. The central unit can control and direct the execution of the instructions or portions of software code of the program or programs according to the invention, which instructions are stored in the hard disk or in the read-only memory or else in the other abovementioned storage elements.

The invention claimed is:

1. A method for analyzing faults in a transmission line network comprising at least one line segment and having a plurality of ends, said method comprising the steps of:
   acquiring, at at least two ends of the line network, a measurement of a signal being propagated in the line network,
   applying a time reversal to each signal measurement to obtain a time-reversed measurement of the signal,
   for each segment of the line network, constructing a cost function dependent on a time and a distance from a point of the segment to an end of the line network, by adding together the measurements of signals time-reversed and delayed by a propagation time of the signal between the point of the segment and the end of the line network associated with the measurement,
   searching for at least one extremum of the cost function over all of the segments of the line network and retaining the coordinates of the extremum, deducing therefrom the presence of a fault at a position and an instant of occurrence that are given by the coordinates of the extremum.

2. The method for analyzing faults in a transmission line network of claim 1, wherein, to construct the cost function, the measurements of time-reversed and delayed signals are weighted by an estimate of the inverse of an aggregated transmission coefficient between the end associated with the measurement and the segment of the line network.

3. The method for analyzing faults in a transmission line network of claim 1, wherein, to construct the cost function, the measurements of time-reversed and delayed signals are weighted by an estimate of an attenuation coefficient dependent on the distance between the point of the segment and the end of the line network associated with the measurement.

4. The method for analyzing faults in a transmission line network of claim 3, wherein the estimate of an attenuation coefficient depends on the line network segment.

5. The method for analyzing faults in a transmission line network of claim 1, further comprising the construction of a piecewise cost function defined over a plurality of intervals by the cost function corresponding to each segment of the line network.

6. The method for analyzing faults in a transmission line network of claim 1, wherein the search for at least one extremum of the cost function is performed by means of a gradient descent optimization algorithm.

7. The method for analyzing faults in a transmission line network of claim 1, comprising a preliminary detection of a pulse characteristic of the presence of a fault in at least one of the measurements.

8. A device for analyzing faults in a transmission line network comprising at least one line segment and having a plurality of ends, the device comprising:
at least one measurement unit for acquiring, at at least two ends of the line network, a measurement of a signal being propagated in the line network,
a component configured to:
apply a time reversal to each signal measurement to obtain a time-reversed measurement of the signal,
for each segment of the line network, construct a cost function dependent a time and on a distance from a point of the segment to an end of the line network, by adding together the measurements of signals time-reversed and delayed a propagation time of the signal between the point of the segment and the end of the line network associated with the measurement,
search for at least one extremum of the cost function over all of the segments of the line network and retaining the coordinates of the extremum,
deduce therefrom the presence of a fault at a position and an instant of occurrence that are given by the coordinates of the extremum.

9. The device for analyzing faults of claim 8, further comprising a means for displaying the position and the instant of occurrence of a fault.

10. A tangible non-transitory processor-readable recording medium on which is stored a program comprising instructions for executing a method for analyzing faults in a transmission line network comprising at least one line segment and having a plurality of ends, said method comprising the steps of:
acquiring, at at least two ends of the line network, a measurement of a signal being propagated in the line network,
applying a time reversal to each signal measurement to obtain a time-reversed measurement of the signal,
for each segment of the line network, constructing a cost function dependent on a time and a distance from a point of the segment to an end of the line network, by adding together the measurements of signals time-reversed and delayed by a propagation time of the signal between the point of the segment and the end of the line network associated with the measurement,
searching for at least one extremum of the cost function over all of the segments of the line network and retaining the coordinates of the extremum, deducing therefrom the presence of a fault at a position and an instant of occurrence that are given by the coordinates of the extremum.

* * * * *